(12) United States Patent
Ballantyne et al.

(10) Patent No.: US 6,803,868 B2
(45) Date of Patent: Oct. 12, 2004

(54) METHOD AND APPARATUS OF PRODUCING A DIGITAL DEPICTION OF A SIGNAL

(75) Inventors: Selina A Ballantyne, Malvern (GB); Adrian S Coffey, Malvern (GB); Martin Johnson, Malvern (GB); Robin Jones, Malvern (GB)

(73) Assignee: QinetiQ Limited, Farnborough (GB)

( * ) Notice: Subject to any disclaimer, the term of this patent is extended or adjusted under 35 U.S.C. 154(b) by 0 days.

(21) Appl. No.: 10/311,887

(22) PCT Filed: Jun. 20, 2001

(86) PCT No.: PCT/GB01/02691

§ 371 (c)(1),
(2), (4) Date: Dec. 23, 2002

(87) PCT Pub. No.: WO01/99286

PCT Pub. Date: Dec. 27, 2001

(65) Prior Publication Data

US 2003/0179018 A1 Sep. 25, 2003

(30) Foreign Application Priority Data

Jun. 21, 2000 (GB) .............................. 0015148

(51) Int. Cl.⁷ .............................................. H03M 1/10
(52) U.S. Cl. ...................................... 341/123; 341/155
(58) Field of Search ................................. 341/123, 155

(56) References Cited

U.S. PATENT DOCUMENTS

| | | | | |
|---|---|---|---|---|
| 4,370,643 A | * | 1/1983 | Kitamura | .................... 341/123 |
| 4,680,797 A | | 7/1987 | Benke | |
| 4,839,649 A | * | 6/1989 | Imai et al. | ..................... 341/65 |
| 4,908,622 A | * | 3/1990 | Turai | ........................... 341/122 |

FOREIGN PATENT DOCUMENTS

| | | |
|---|---|---|
| EP | 0282147 | 9/1988 |
| EP | 0349664 | 1/1990 |
| GB | 1601749 | 11/1981 |
| GB | 2179516 A | 3/1987 |
| GB | 2201056 A | 8/1988 |
| GB | 2210741 A | 6/1989 |
| WO | 99/34572 A3 | 7/1999 |
| WO | 99/34572 A2 | 7/1999 |

OTHER PUBLICATIONS

Koen M.: "High Performance Analog to Digital Converter Architectures"; *Proceedings of the Bipolar Circuits and Technology Meeting*; Minneapolis; Sep. 18–19, 1989; New York—IEEE; Sep. 18, 1989; pp. 35–43; (XP000089824).

Balasubramanian K., et al.; "A Novel Method for Optimal Sampled Data Selection, Transmission Andreconstruction: A Proposal"; *1999 IEEE Instrumentation and Measurement Technology Conference*; Apr. 23–26, 1995; pp 421–425; (SP000534889).

Honary B., et al.; "Adaptive–Rate Sampling Applied to the Efficient Encoding of Speech Waveforms"; *National Conference on Telecommunications*, York; Apr. 2–5, 1989; pp 352–357 (XP000041209).

* cited by examiner

*Primary Examiner*—Howard L. Williams
(74) *Attorney, Agent, or Firm*—Nixon & Vanderhye P.C.

(57) ABSTRACT

An apparatus for producing a digital depiction of a signal (10) which is adaptive to the signal itself. A constant rate sampling means, such as an analogue to digital converter (2), samples the signal (10) at a constant rate and produces a first digital depiction (12) of a signal. A transformation means (14) is responsive to the first digital depiction (12) and produces a second digital depiction based on the evolution of the signal. The transformation means may be capable of determining when a predetermined threshold level has been crossed and measuring the time interval between predetermined threshold level crossings. The transformation means (14) may include a logic arrangement and a timer counter and is run from a clock signal (16) from the same clock (6) as drives the sampling means. A method of adapting a conventional ADC (2) to adaptively sample the signal (10) by adding a transformation means (14) run off the same clock (6) as the ADC (2) is also provided.

14 Claims, 3 Drawing Sheets

METHOD AND APPARATUS OF PRODUCING A DIGITAL DEPICTION OF A SIGNAL

Figure 1A:
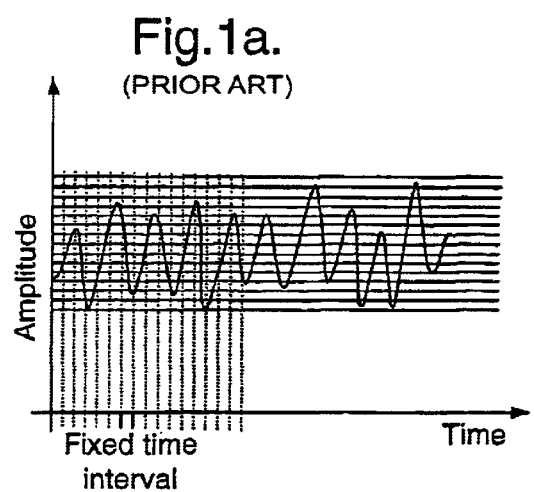

This application is the U.S. national phase of international application PCT/GB01/02691 filed in English on Jun. 20, 2001 which designated the U.S. PDT/GB01/02691 claims priority to GB Application No. 0015148.0 filed Jun. 21, 2000. The entire contents if these applications are incorporated herein by reference.

This invention relates to a method and apparatus for producing a digital depiction of a signal, in particular for producing an adaptive digital depiction.

Conventional analogue to digital converters (ADCs) are well known. These enable an analogue input signal to be converted into a digital depiction of the input signal.

Various types of ADC are known. Possibly the simplest is the zero crossing discriminator wherein the output changes from a logical naught to a logical one when the output crosses a reference voltage of zero volts. More sophisticated ADCs comprise a number of threshold crossing discriminators each with its own reference voltage, where adjacent reference voltages are spaced apart by a common amount or have some other means for achieving an equivalent effect. For example the outputs of sixteen discriminators expressed as a binary code would indicate that the input voltage lay somewhere between two particular reference voltages. However, for any significant amount of noise at the input, the input signal cannot be considered static during the conversion processes causing the output digital depiction to change rapidly and be almost indeterminate. To overcome this problem the input signal is held constant using a 'track and hold' circuit and the resulting unambiguous output digital depiction during the 'hold phase is latched into a register by sample pulses which occur at equally spaced intervals of time.

Analogue to digital conversion in which the input analogue signal is periodically sampled at a predetermined constant rate and covered into a digital depiction are standard. To convert an analogue signal having high frequency components a higher sampling rate must be used resulting in an increased amount of output digital information. Further the high sampling rate results in an increased amount of unnecessary digital information for sections of the analogue input which have a relatively low frequency. For analogue signals having both high and low frequency components a low sampling rate is not appropriate as the high frequency components cannot be then correctly identified. Conventionally the choice of regular sampling rate is subject to the well known Nyquist sampling criteria i.e. that the rate of sampling should be greater than twice the maximum frequency component of the signal.

An alternative to sampling at a constant rate is described in International Patent Application No. PCT/US98/7592. When the input signal changes in amplitude by an amount that exceeds a predetermined threshold level a digital message is output containing information about the change in amplitude, the polarity of the change and the elapsed time for the change. Therefore samples are only taken when the signal itself changes by a predetermined amount and as such the sampling rate is determined by the signal itself. This is an example of an adaptive sampling technique. As used in this specification the term 'adaptive' shall be used to indicate a sampling system wherein the generation of the digital output is based on the evolution of the signal.

Also the system described in PCT/US98/27592 is a system which requires feedback. The crossing of a threshold level causes the levels of the apparatus to be reset. This need to change levels means that the system is inherently slow compared with a flow through system, such as a conventional ADC.

U.S. Pat. No. 4, 680, 797 describes a coder for secure communication of speech which determines certain critical points within a signal and determines the vectors between key points and transmits those vectors. The paper by Balasubramanian K et al. ("A Novel Method for Optimal Sampled Data Selection, Transmission and Reconstruction: A Proposal" 1995 IEEE Instrumentation and Measurement Technology Conference. IMTC/95 Waltham Mass. Apr. 23–26, 1995 Proceedings of the Instrumentation and Measurement Technology Conference) similarly discloses a system which identifies key points in the signal and transmits samples only at those points. Both of these systems require analysis of the signal to determine key or critical points however.

Honary B et al: "Adaptive-Rate Sampling Applied to the Efficient Encoding of Speech Waveforms" National Conference on Telecommunications, York, 2–5 Apr., 1989, London IEE, vol. CONF 2, 2 Apr. 1989, pages 352–357 teaches a system where the signal is analysed and, based on that analysis the sampling rate is varied accordingly to ensure accurate sampling. The resultant signal is complex however and the bandwidth of the signal needs to be quickly assessed.

It is therefore an object of the present invention to provide a method and apparatus for producing a digital depiction of a signal which is adaptive and which mitigates at least some of the aforementioned disadvantages.

According to the present invention therefore there is provided an apparatus for producing a digital depiction of a signal comprising a sampling means for sampling the signal at a constant rate determined by a clock and providing a first digital depiction containing information regarding the signal amplitude at each sampling time, and a transformation means responsive to the first digital depiction for producing a second digital depiction, characterised in that the transformation means is capable of determining that the signal has changed in amplitude by a certain threshold amount and determining the elapsed time for the signal to change by said amount and producing the second digital depiction based on the elapsed times for the signal to change by predetermined amounts, and in that the sampling rate is set such that the signal varies by less than the predetermined amount between successive samples.

This is an example of adaptive sampling wherein the evolution of the signal, as represented by the first digital depiction, is used to determine what adapted depictions are output.

By using the evolution of the signal itself to produce the second digital depiction the output of the second digital signal can be significantly lower than the first digital depiction. For example when the rate of change of the signal is low that fact can be used to produce a more compact digital depiction with less information than the first digital depiction. The first digital depiction is sampled at a constant rate and so will over sample a low frequency component of the signal but the second digital depiction can avoid this.

Also the second digital depiction could present the information about the signal in a form which is more suited for a particular application. For instance in waveform matching applications it may be desired to match similar waveforms evolving in different time scales. The constantly sampled first digital depiction has a temporal dependence on the sampling process but the second digital depiction, using the signal evolution, can avoid this.

Further, by using a sampling means run at a constant rate to generate a first digital depiction high speed components and conventional digital sampling technology can be used and the adaptive part of the sampling can be carried out in the digital regime.

Preferably the second digital depiction is a digital representation. As used throughout this specification the term 'digital depiction' shall be taken to mean any digital output which contains information about the signal. The term 'digital representation' however shall be taken to mean a representation that digitally describes a signal in such a way that the signal could be reproduced directly by feeding the depiction to a suitable reconstituter, such as a digital to analogue converter, without requiring any preliminary processing. The digital messages produced in PCT/US98/27592 for instance would require prior processing and so do not constitute a digital representation.

In one convenient embodiment the transformation means is capable of determining that the signal has crossed a predetermined threshold level and determining the time interval between crossing a first predetermined threshold level and a second different predetermined threshold level and producing a second digital depiction of the signal. Conveniently the transformation means includes a timer counter means for counting the number of cycles of a clock signal to determine the time interval between predetermined threshold level crossings.

By measuring the time interval between the signal crossing predetermined threshold levels the rate of change of the signal is used to determine when samples are taken. For instance when the signal is changing slowly there is no redundant sampling, simply a longer interval is recorded. This results in the second digital depiction having far fewer digital outputs than the first digital depiction.

The sampling means takes samples at a regular rate determined by the clock. The output of the sampling means gives an estimate of what the amplitude of the signal is at the time at which it is sampled. The transformation means looks at the first digital depiction and from that signal determines when a predetermined threshold level has been crossed and starts timing the time interval until the transformation means determines that a different predetermined threshold level has been crossed.

The time at which the signal crossed the predetermined threshold level will not be known exactly. However the time intervals are measured digitally by counting the number of cycles of a clock that occur between the level crossings. This process inherently involves a maximum error in the measurement of the interval equal to the time between clock cycles. The error in the measurement of the interval will dominate any error in determining when a predetermined threshold was crossed. Because of this error it is not necessary to know exactly when a predetermined threshold level is crossed.

Preferably the clock signal driving the sampling means and transformation means are derived from the same clock. Using signals derived from the same clock to drive both the sampling means and the transformation means ensures no error is introduced because the clocks are unsynchronised which reduces the error of the system compared with using entirely independent clock signals. If independent clock signals are used for the sampling means and the transformation means the dock signal of the transformation means is preferably faster that that of the sampling means. Where the clock signals are derived from the same clock the clock signals preferably run at the same rate. However this will give a minimum interval indication of either 1 or 0 depending on how the system is set up. If a different number were required for the minimum interval the clock of the transformation means could be faster by a factor of K, where K is the desired number for the minimum interval.

Preferably the sampling means comprises an analogue to digital converter. Fast ADCs are readily available. Conveniently the ADC used could be a sampled flash ADC.

Preferably the sampling means includes an anti aliasing filter which serves to limit the fastest rate of change of the input signal.

Conveniently the transformation means comprises an arrangement of logic gates. Probably the transformation means would comprise a suitably programmed Field Programmable Gate Array (FPGA) or Application Specific Integrated Circuit (ASIC).

The second digital depiction may consist of information about the elapsed time between predetermined threshold level crossings. Advantageously the transformation means may also comprise means for determining in which direction the signal has crossed a predetermined threshold level and wherein the second digital depiction includes an UP/DOWN digital output signal to indicate in which direction, UP or DOWN, the signal has crossed the predetermined threshold level.

In a second aspect of the present invention there is provided a method of producing a digital depiction of a signal comprising the steps of sampling a signal at a constant rate determined by a first dock signal to provide a first digital depiction with information about the amplitude of the signal at each sampling time characterised in that it further comprises the steps of;

monitoring said first digital depiction to determine when the signal has changed in amplitude by a certain threshold amount, and determining the elapsed time for the signal to change by said amount and producing a second digital depiction based on the elapsed times for the signal to change by predetermined amounts, and in that the step of sampling the signal involves sampling the signal at a rate that is set such that the signal varies by less than the predetermined amount between successive samples.

Preferably the second digital depiction is a digital representation.

In one particular embodiment the method includes the steps of determining when a predetermined threshold level has been crossed, determining the elapsed period of time between the signal crossing a first predetermined threshold level and crossing a second different predetermined threshold level using a second clock signal, and providing a second digital depiction of the signal.

Preferably the rate of sampling the signal is sufficient such that the signal will not cross more than one predetermined threshold level between successive samples. This is important when a digital representation is to be produced.

Conveniently the method includes the step of determining the direction of change of the signal as it crosses a predetermined threshold level and providing a digital output of the direction of change, UP or DOWN in the second digital depiction.

Preferably the second clock signal is derived from the same clock as the first clock signal. Conveniently the first and second clock signals run at the same rate. As a less preferable alternative the first and second clocks signals may be derived from different clocks in which case the second dock signal is advantageously run faster than the first clock signal.

The present invention can be applied to existing conventional ADCs to allow for adaptive sampling. Therefore in a third aspect of the present invention there is provided a method for adapting a constant sampling rate ADC to carry out adaptive sampling comprising the steps of taking an analogue to digital converter that samples a signal at a constant rate in response to a clock signal, and introducing the output of the analogue to digital converter to a transformation means characterised in that the transformation means is responsive to the output of the analogue to digital converter and is capable of determining when the signal has changed in amplitude by a certain threshold amount and determining the elapsed time for the signal to change by said amount and producing a second digital depiction based on the elapsed times for the signal to change by predetermined amounts, and in that the sampling rate is set such that the signal varies by less than the predetermined amount between successive samples.

Preferably the second digital depiction is a digital representation.

In one example the transformation means is capable of determining when a predetermined threshold level is crossed by the signal, determining the elapsed time between this crossing and the signal crossing another predetermined threshold level, and producing a digital depiction of the signal.

Conveniently the method includes the step of supplying a clock signal to the transformation means from the same clock that controls the sampling rate of the analogue to digital conversion.

Preferably the transformation means comprises an arrangement of logic gates. Conveniently the transformation means includes a timer counter.

Preferably the sampling rate of the analogue to digital conversion means is adapted such that the signal crosses no more than one predetermined threshold level between successive samples.

Figure 1B:
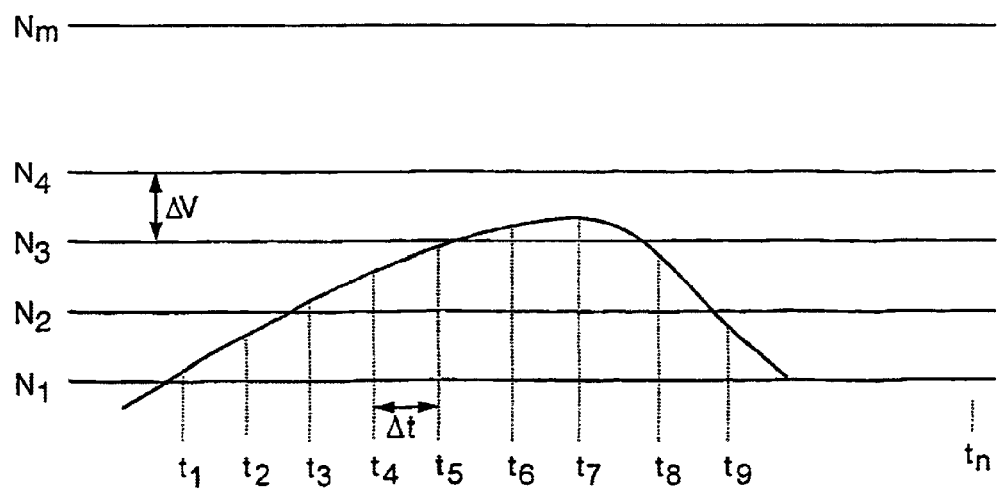
Figure 2:
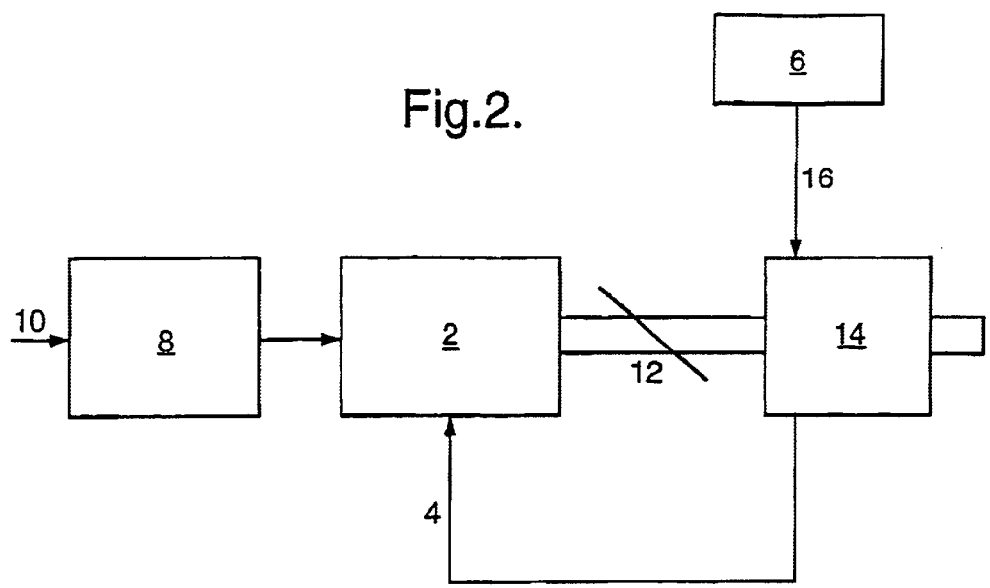
Figure 3:
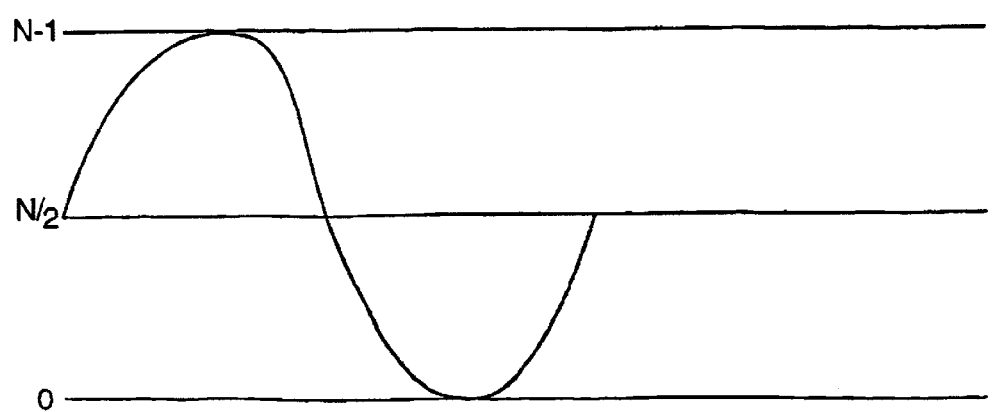
Figure 4:
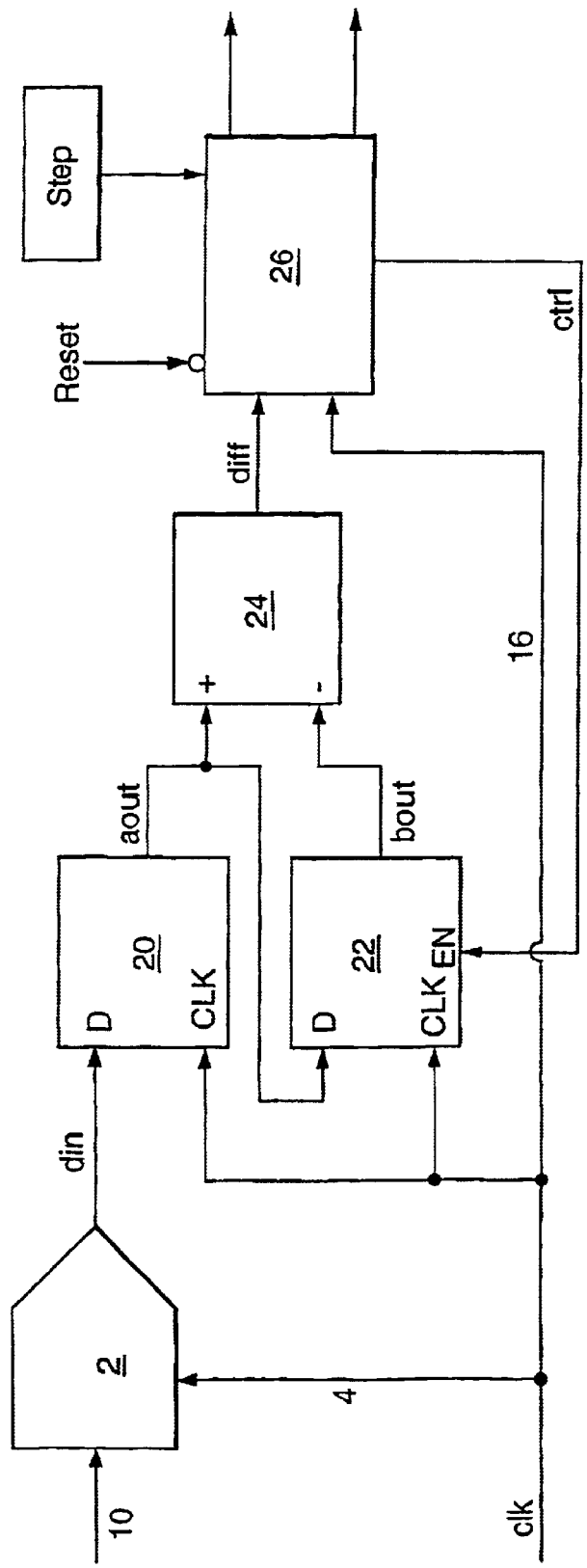

The invention will now be further described by way of example only with reference to the following drawings of which;

FIG. 1a shows a conventional analogue to digital sampling process in which the signal is sampled at fixed time interval, FIG. 1b shows a conventional sampling process where the signal is highly oversampled, FIG. 2 shows a block diagram of an embodiment of the present invention, FIG. 3 illustrates a band limited input signal at maximum amplitude of the analogue to digital converter, and FIG. 4 shows a logic arrangement for determining when the signal has crossed a predetermined threshold level and measuring the elapsed time between predetermined threshold level crossings.

In a conventional ADC the input analogue system is sampled at a fixed rate and samples are then converted to give a digital depiction of the original signal (which is actually a digital representation). This sampling process is illustrated in FIG. 1. To convert analogue signals having high frequency components a relatively short sampling period, $\Delta t$, must therefore be used. However this results in an increased rate of output digital code. Further the high sampling rate results in an increased amount of unnecessary digital code for sections of the analogue input which have a relatively low frequency. Conventionally, if the highest frequency component of an analogue signal is not known the sampling frequency is determined by a band limiting filter applied to the input and the sampling frequency must be at least twice the bandwidth of this filter.

In FIG. 1a the sampling occurs at a rate slightly greater than the minimum sampling rate determined by the Nyquist criteria. It can be seen that the signal can cross many levels of the ADC between samples. FIG. 1b illustrates a conventional sampling process where the signal is highly oversampled, i.e. the sampling rate is very much greater than the minimum rate determined by the Nyquist criteria. It can be seen that the ADC samples at various times, $t_1 \ldots t_n$. The ADC has a certain number of different threshold voltages shown as the levels $N_0 \ldots N_m$. At each sampling time the readout of the ADC gives an indication that the signal amplitude at that time is between any two particular levels. Each level is separated from an adjacent level by a fixed amount, $\Delta V$.

The digital depiction output from the ADC would therefore be a digital depiction of what voltage levels the signal was between when the sample was taken. As each sample is separated in time by a fixed amount this information could then be used to reconstitute the signal.

In the present invention however it is realised that the signal itself can be used to determine when samples should be taken, rather than just taking samples at a fixed rate. It is also appreciated that as the digital depiction produced by a conventional ADC is exactly that, a digital depiction of the signal, this digital depiction can be used as a basis for adaptive sampling.

FIG. 2 shows a schematic an embodiment of the present invention. A conventional ADC, 2, is sampled at a constant rate driven by a first clock signal, 4. The ADC also has an anti-aliasing filter, 8, to define the maximum frequency of the input signal, 10, which can be passed to the ADC. The ADC samples the input signal, 10, and produces a first digital depiction 12. The arrangement as described so far is conventional.

However the apparatus also includes a logic arrangement 14. This logic arrangement is responsive to the first digital depiction, 12 and determines when a predetermined threshold level has been crossed. The logic arrangement will also include a timer counter.

Referring back to FIG. 1b, for the signal shown therein the digital depiction output by the ADC could be thought of as simply a digital sequence of the levels that the signal was at when sampling occurred. This could be represented in this instance as $N_1, N_{1, N2}, N_2, N_2, N_3, N_3, N_2, N_1$.

It can be seen that between sampling period $t_2$ and sampling period $t_3$ the level output from the ADC changes from $N_1$ to $N_2$. This can be used to indicate that the signal has crossed a predetermined threshold level, the predetermined threshold being the level $N_2$. As the output of the ADC is a digital code each level is represented as a number. Therefore taking the output at any one sample time and subtracting the output at the previous time will reveal whether a predetermined threshold level has been crossed. In this simple example the result would be zero for no level crossing but +1 or −1 if a single level had been crossed.

Referring back to FIG. 2, when the logic arrangement, 14, determines that a predetermined threshold level has been crossed it starts timing the interval until another level crossing occurs. The logic arrangement 14 counts the number of clock cycles from a second clock signal 16 from clock 6.

It can then be seen that in the example shown in FIG. 1b between time periods $t_5$ and $t_6$ the level output by the ADC again changes, from $N_2$ to $N_3$. Again the logic arrangement 14 determines this change. The logic arrangement will have counted a certain number of cycles of the second clock signal 16 and thus outputs this number as a depiction of the interval between crossing levels $N_1$ and $N_2$. The timer counter is also reset to start counting for the next time interval.

The direction of crossing the level can also be determined and can be part of the second digital depiction. It can be seen looking back at FIG. 1 that the operation of subtracting the level at the current sampling point from that of the previous sample would result in +1 at time period $t_3$ indicating that a level had been crossed and the signal had crossed upwards. At time period $t_4$ the result would be zero indicating that no level had been crossed. At time period $t_9$ however the same operation will give −1 as the result indicating that a level had been crossed and that the signal was moving downwards.

The information regarding the direction of level crossing may be included as part of the second digital depiction output by the apparatus.

The predetermined threshold levels of interest may be more than one level of the ADC and the logic is arranged accordingly. For instance if the predetermined threshold levels of interest are $2\Delta V$ apart the logic arrangement must be capable of determining when a predetermined threshold level of interest has been crossed but ignoring crossings of ADC levels which are not threshold levels of interest. In FIG. 1b if levels $N_1$ and $N_3$ were predetermined threshold levels of interest but $N_2$ was not, the logic must be capable of determining that crossing from level $N_1$ to level $N_2$ does not represent a predetermined threshold level crossing but that crossing from level $N_2$ to $N_3$ does. The person skilled in the art would be well aware of how to achieve such result, for instance the value at a predetermined threshold level of interest could be stored in the logic arrangement and not until the difference between that level and the currently sampled level was +2 would another predetermined threshold level be detected.

Further the logic arrangement is preferably adapted such that an interval is started being timed when a particular predetermined threshold level of interest is crossed but is not stopped until a different level of interest is crossed. Thus if every level of the ADC was a predetermined threshold level the logic arrangement would detect a predetermined threshold crossing at time $t_6$ as the signal will have crossed from level $N_2$ to level $N_3$. However it will not stop timing the interval until time $t_9$ where the signal crosses from level $N_2$ to level No. Thus the system will ignore the signal recrossing the same threshold level $N_2$.

The reason for this is that practically the input signal will almost certainly have an amount of noise. This noise will effectively be a modulation of the signal at the fastest rate of change allowed by the filter. Therefore for a noisy signal the signal will generally cross and recross the same threshold level several times in quick succession whereas the 'true' signal actually only crosses once. Therefore to avoid multiple false readings being obtained the system only registers an interval when a different predetermined threshold level is crossed.

Referring again to FIG. 1b it is noted that the absolute time at which a particular predetermined threshold crossing occurs is not measured exactly. Thus the indications of level crossing taken from the first digital depictions are only approximates.

There is therefore an error introduced into the measurement of the time interval which is proportional to the frequency of the sampling above a certain minimum and which depends on $\Delta V$. However the measurement of the time interval between level crossings is carried out digitally by counting the number of cycles of the clock signal between level crossings. This process inherently introduces an error equal to one clock cycle of the interval timer.

This error, the error in the interval measurement, will dominate the error introduced by not detecting exactly when a predetermined threshold level is crossed and so it is not necessary to know exactly when a predetermined threshold level was crossed. To generate a useful second digital depiction, and to generate a digital representation of the signal, it is important to ensure that the signal does not cross more than one predetermined threshold level in the time between successive samples. Therefore in the time that the signal moves $2\Delta V$ the system should take two samples and it is this criteria which determines the minimum sampling frequency.

Most ADCs have a filter on the input signal to define the maximum or band-limited frequency, $f_{bl}$, which may be passed to the ADC. The ADC is capable of discriminating N levels separated by $\Delta V$ and therefore the maximum amplitude is $N\Delta V$.

Imagine a sine wave input at the band limit frequency and having an amplitude equal to $N\Delta V$ as shown in FIG. 3. It can be seen that the fastest the signal changes is in the region of crossing the N/2 level. Therefore for at least one sample in each change of $\Delta V$ the ADC must sample at a time interval of $S_1$ or faster where $$S_1 = \sin^{-1}(2N)/(2\pi f_{bl})$$

Therefore the minimum sampling frequency, $f_{sam}$, is $$f_{sam} = (2\pi f_{bl})/\sin^{-1}(2/N)$$

Sampling at this rate should guarantee that each level crossing is detected. Of course not every level of the ADC may be a threshold level of interest and if a predetermined threshold of three levels say or $3\Delta V$ is required the sampling rate that the ADC need work at is correspondingly reduced.

Referring again to FIG. 2 the logic means determines the elapsed time between predetermined threshold level crossings by counting cycles of a clock signal derived from the same clock as used to control the sampling ADC. Hence clock 6 supplies a signal to the logic arrangement which then supplies first clock signal 4 to the ADC 2. By ensuring that the two clock signals are derived from the same clock the signals can be phase locked. This ensures that there is no error introduced due to a difference in when the interval measurement starts and when the sample was actually taken. Thus the error is fixed as being equally to one clock cycle of the counter dock.

Were different clock signals to be used the beat frequency between the two different signals would introduced errors into the system. However if a clock signal were to be used for the timer counter of the logic arrangement it would preferably be from a stable clock system running at a faster rate than the ADC so as to reduce errors in the interval measurement.

As the system described above uses a conventional ADC, which would normally require with an anti-aliasing filter, to generate the first digital depiction it is possible to adapt existing ADC doing conventional constant rate sampling to produce an adaptive digital depiction.

Referring to FIG. 2 the existing ADC, 12, has some logic, 14, added to process the digital depiction from the ADC. It is likely that the existing ADC arrangement will not be oversampling the ADC enough to achieve the minimum sampling frequency described above.

Therefore either the ADC can be sampled faster using a different clock signal or the filter can be altered so as to reduce the band limited frequency that can be passed to the ADC. Where a new clock signal is to be introduced the existing sampling clock can be replaced with a faster clock which also supplies a signal to the logic arrangement 14. Alternatively the existing ADC clock could be used with a faster signal being derived therefrom. Supplying a faster sampling signal to the ADC is relatively simple and avoids the need to change the filter which could be complex and expensive. Also the bandwidth that the ADC can cope with is greater with a faster sampling rate. If the ADC cannot cope with the increased sampling rate it is usually easier to upgrade the ADC rather than alter the filter. However where the ADC is not able to be run any faster and is not to be replaced it will be necessary to limit the maximum frequency that can be passed to the ADC to attain sufficient oversampling. This could be achieved by replacing or altering the existing filter or adding another filter. In this embodiment the ADC clock can be routed to the logic arrangement which can use this signal to control the logic arrangement.

FIG. 4 shows a suitable system for implementing the adaptive sampling described above where like components are given like numerals. The ADC, 2, receives the input signal 10 and produces a first digital depiction 12. The output of this passes to a delay arrangement 20, 22 which delays a previous digital output so that subtractor 24 can pass the difference in the output to the logic 26. Logic 26 then produces an output which is indicative of the direction of level change, 28, and the time interval, 30.

It will be clear to one skilled in the art that there are different types of output from ADCs. For instance the output could be a binary code, a binary coded decimal or a thermometer coding. The logic arrangement used will differ depending upon the coding used as will be readily appreciated by one skilled in the art.

It is noted that the above description concentrates on one useful form of adaptive sampling but it will be apparent to one skilled in the art that other schemes are possible. For instance longer past history of the signal could be used, i.e. information regarding the last several predetermined levels of interest crossed. The present invention should not be seen as being limited to any one form of adaptive sampling.

What is claimed is:

1. An apparatus for producing a digital depiction of a signal comprising;
    a sampling means for sampling the signal at a predetermined constant rate determined by a clock and providing a first digital depiction containing information regarding the signal amplitude at each sampling time, and
    a transformation means responsive to the first digital depiction for producing a second digital depiction;
    wherein the transformation means comprises means for determining whether that the signal has crossed a first predetermined threshold level, for determining time interval for the signal to change from said first predetermined threshold level to a second predetermined threshold level, wherein
    the predetermined constant sampling rate is set such that the signal cannot cross more than one predetermined threshold level between successive samples of the sampling means; and wherein the second digital depiction comprises the time interval and direction of threshold crossing.

2. An apparatus according to claim 1 wherein the second digital depiction has a lower digital output than the first digital depiction.

3. An apparatus as claimed in claim 1 wherein the transformation means includes a timer counter means for counting the number of cycles of a clock signal to determine the time interval between predetermined threshold level crossings.

4. An apparatus according to claim 3 wherein the clock signal driving the sampling means and transformation means are derived from the same clocks.

5. An apparatus according to claim 1, wherein the sampling means comprises an analogue to digital converter.

6. An apparatus according to claim 5 wherein the analogue to digital converter comprises a flash analogue to digital converter.

7. An apparatus according to claim 5, wherein the transformation means comprises an arrangement of logic gates.

8. An apparatus according to claim 1 wherein the sampling means includes an anti aliasing filter which serves to limit the fastest rate of change of the input signal.

9. A method of producing a digital depiction of a signal comprising the steps of:
    sampling a signal at a constant rate determined by a first clock signal to provide a first digital depiction with information about the amplitude of the signal at each sampling time;
    monitoring said first digital depiction and determining an elapsed period of time between said signal crossing a first predetermined threshold level and crossing a second and different predetermined threshold level using a second clock; signal and
    producing a second digital depiction comprising the elapsed times for the signal to change by predetermined amounts and a direction of level crossing, wherein
    the step of sampling the signal involves sampling the signal at a rate where the signal cannot cross more than one predetermined threshold between successive samples.

10. A method according to claim 9, wherein the second clock signal is derived from the same clock as the first clock signal.

11. A method for adapting a constant sampling rate ADC to carry out adaptive sampling comprising the steps of
    taking an analogue to digital converter that samples a signal at a constant rate in response to a clock signal, and
    introducing the output of the analogue to digital converter to a transformation means,
    wherein the transformation means is responsive to the output of the analogue to digital converter and is capable of determining when the signal has crossed a predetermined threshold level and determining the time interval between the signal crossing a first predetermined threshold level and a second and different predetermined threshold level and producing a second digital depiction comprising the time intervals and the direction of change,
    wherein the predetermined constant sampling rate of the analog to digital convertor is adapted such that the signal cannot cross more than one predetermined threshold between successive samples.

12. A method according to claim 11 wherein the method includes the step of supplying a clock signal to the transformation means derived from the same clock that controls the sampling rate of the analogue to digital conversion.

13. A method according to claim 11, wherein the transformation means comprises an arrangement of logic gates.

14. An apparatus for producing a digital depiction of a signal comprising;

a sampling means for sampling the signal at a predetermined constant rate determined by a clock and providing a first digital depiction containing information regarding the signal amplitude at each sampling time, and a transformation means responsive to the first digital depiction for producing a second digital depiction wherein the transformation means comprises means for determining whether that the signal has crossed a first predetermined threshold level, for determining a time interval for the signal to change from said first predetermined threshold level to a second predetermined threshold level, wherein the predetermined constant sampling rate is set such that the signal cannot cross more than one predetermined threshold level between successive samples of the sampling means; and wherein the second digital depiction comprises only the time interval and direction of threshold crossing.

* * * * *